(12) United States Patent
Fuisting

(10) Patent No.: US 10,505,360 B2
(45) Date of Patent: Dec. 10, 2019

(54) METHOD AND DEVICE FOR DETERMINING A LOAD CURRENT

(71) Applicant: Hella KGaA Hueck & Co., Lippstadt (DE)

(72) Inventor: Manfred Fuisting, Warendorf (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 191 days.

(21) Appl. No.: 15/554,757

(22) PCT Filed: Mar. 2, 2016

(86) PCT No.: PCT/EP2016/054451
§ 371 (c)(1),
(2) Date: Aug. 31, 2017

(87) PCT Pub. No.: WO2016/139263
PCT Pub. Date: Sep. 9, 2016

(65) Prior Publication Data
US 2018/0241194 A1    Aug. 23, 2018

(30) Foreign Application Priority Data

Mar. 4, 2015   (DE) .................. 10 2015 103 146

(51) Int. Cl.
*G01R 31/02* (2006.01)
*H02H 3/08* (2006.01)
(Continued)

(52) U.S. Cl.
CPC ........... *H02H 3/08* (2013.01); *G01R 19/0092* (2013.01); *G01R 31/3277* (2013.01); *H02H 1/0007* (2013.01); *H02H 3/006* (2013.01)

(58) Field of Classification Search
CPC .. G01R 19/00; G01R 19/0092; G01R 31/327; G01R 31/3277; H02H 3/006; H02H 3/08; H02H 1/0007
See application file for complete search history.

(56) References Cited

U.S. PATENT DOCUMENTS 6,100,675 A * 8/2000 Sudo ...................... H02M 3/156
323/282
7,170,267 B1 * 1/2007 McJimsey ............. H02M 3/156
323/271

(Continued)

FOREIGN PATENT DOCUMENTS

EP         1213189 A1    6/2002
WO    2013/038176 A2    3/2013

*Primary Examiner* — Thang X Le
(74) *Attorney, Agent, or Firm* — Husch Blackwell LLP

(57) ABSTRACT

Determining a load current (IL) in a semiconductor switch, which has a measuring device, wherein a measurement of the load current (IL) is influenced by a transmission factor (k), depending on the measuring device, wherein the following steps are carried out: (a) execution of a first measurement of the load current (IL) with a first transmission factor (k1), wherein a first measurement result is determined with the first measurement; (b) execution of a second measurement of the load current (IL) with a second transmission factor (k2), wherein a second measurement result is determined with the second measurement, and the first transmission factor (k1) differs from the second transmission factor (k2), in order to identify an error (IF) in the measurement results; and (c) determination of a corrected measurement result through a comparison of the first measurement result with the second measurement result, such that the error (IF) is at least reduced.

3 Claims, 6 Drawing Sheets

(51) Int. Cl.
    *G01R 19/00*     (2006.01)
    *H02H 3/00*     (2006.01)
    *G01R 31/327*     (2006.01)
    *H02H 1/00*     (2006.01)

(56) References Cited

U.S. PATENT DOCUMENTS

| | | | |
|---|---|---|---|
| 2005/0270005 A1* | 12/2005 | Horner | H02M 3/156 323/283 |
| 2007/0035284 A1* | 2/2007 | Schoofs | H02M 3/1584 323/283 |
| 2008/0285318 A1* | 11/2008 | Tan | H02M 1/4225 363/89 |
| 2012/0217944 A1* | 8/2012 | Wada | G01R 19/0092 323/282 |
| 2012/0262151 A1 | 10/2012 | Mandic et al. | |
| 2013/0214805 A1* | 8/2013 | Saloio, Jr. | H02H 3/044 324/750.01 |

\* cited by examiner

METHOD AND DEVICE FOR DETERMINING A LOAD CURRENT

CROSS REFERENCE

This application claims priority to PCT Patent Application No. PCT/EP2016/054451, filed 2 Mar. 2016, which itself claims priority to German Application No. 10 2015 103146.9, filed 4 Mar. 2015, the entirety of both of which are hereby incorporated by reference.

FIELD OF THE INVENTION

The invention relates to a method for determining a load current.

BACKGROUND OF THE INVENTION

It is known from the prior art that electrical fuses and/or relays are increasingly replaced, in particular in vehicles, or motor vehicles, respectively, by electronic components, and in particular by self-protecting semiconductor switches. These preferably integrated semiconductor switches include, e.g. a measuring device having a measuring unit for electrical measurement the current of the load current and/or a self-protection against short circuits. It is possible to monitor and/or evaluate load currents over a specific measuring range with the measuring device.

It is disadvantageous with known solutions for devices with semiconductor switches, that an electrical current with very low amperage can only be detected (determined) with a high level of inaccuracy. It is often desirable thereby, to enlarge the measuring range, in order to detect, e.g. electrical currents in a measuring range of, in particular, ca. 0 A (ampere) to at least 40 A, with a high level of accuracy and/or precision, wherein very low currents, e.g. <10 mA (milliampere) are to be determined as well. Such an enlargement of the measuring range and/or improvement of the accuracy are associated thereby with the high costs for the production of the semiconductor switches. One cause is, e.g., the measurement error, which is prevalent, particularly with measurements of lower currents. Thus, the measurements of the electrical current with the measuring device exhibit a certain error, caused, e.g., by an undesired residual current. The error and/or residual current are caused, e.g., by the measuring device, in particular by an amplifier in the measuring device. The error and/or residual current is dependent, e.g., on manufacturing tolerances, temperature, and the amperage of the load current.

SUMMARY OF THE INVENTION

Therefore, one object of the present invention is to at least partially eliminate the disadvantages described above. In particular, it is the object of the invention to enable an improved and/or more cost-effective determination of a load current for semiconductor switches, wherein the measuring accuracy is preferably increased.

Features and details of the invention can be derived from the respective dependent claims, the description, and the drawings. Features and details described in conjunction with the method according to the invention naturally also apply in conjunction with the device according to the invention, and vice versa, such that with regard to the disclosure of the individual aspects of the invention, reference can also be made or taken reciprocally.

The method according to the invention serves to determine a load current in a semiconductor switch and/or inside a semiconductor switch, in particular for a vehicle, or motor vehicle, respectively. A least one measuring device is provided for this, wherein a measurement of the load current is influenced by a transmission factor that is dependent on the measuring device. The measuring device preferably has at least one measuring unit thereby, in particular a first measuring unit and a second measuring unit, wherein the first measuring unit determines and/or (inherently) has a first transmission factor, and the second measuring unit determines and/or (inherently) has a second transmission factor. The measuring units (i.e. the first and second measuring units) are configured, e.g., as current sensors for measuring current.

According to an example embodiment of the invention, the method comprises the following steps: (a) execution of a first measurement of the load current with a first transmission factor, wherein a first measurement result is determined with the first measurement; (b) execution of a second measurement of the load current with a second transmission factor, wherein a second measurement result is determined with the second measurement, in order to identify an error in the measurement results; and (c) determination of a corrected measurement result through a comparison of the first measurement result with the second measurement result, such that the error is at least reduced, and in particular is substantially eliminated.

This results in the advantage that, through the comparison of the first measurement result with the second measurement result, the error caused in particular by a residual current can be significantly reduced. The load current is very precisely determined or measured thereby, through the determination of the corrected measurement results. Because the error is primarily dominant, or relevant, with low amperages, and prevents a reliable evaluation of the measurement, the method according to the invention also makes it possible, e.g., to detect (i.e. determine) lower load currents, e.g. ≤40 mA and/or ≤20 mA and/or ≤10 mA. The load current is applied to at least one load through the semiconductor switch thereby, wherein the corrected measurement result is proportional to the load current. The corrected measurement result has, in particular, an error, which is lower than the error of the first measurement result and/or the second measurement result.

In particular, the transmission factor is a proportionality factor, and it determines the relationship thereby between the measurement result and the load current. The transmission factor of the measurement unit and/or the respective combination of a measurement unit with further components of the measuring device is preferably inherent, such that a first measuring unit has and/or determines a specific and/or constant and/or known first transmission factor, and the second measuring unit has and/or determines a specific and/or known and/or constant second transmission factor.

The comparison pursuant to step c) is preferably carried out in order to determine a corrected measurement value with a reduced error, having an at least reduced dependency on residual current, temperature (e.g. temperature and/or ambient temperature of the semiconductor switch) and/or load current, and/or a lower error tolerance. The error is a measurement error in particular, caused by at least one component of the measuring device, in particular an amplifier unit, and in particular by a residual current. The measuring device and/or the semiconductor switch are configured in particular such that the residual current is exclusively positive and/or negative (but never 0 A), and always has a specific amperage that is, for example, not equal to 0 A. With an ideal residual current of 0 A (amperes), the measurement signal measured at the output of the measuring device, and thus the measurement result, would likewise be 0 A, when the load current amperage is 0 A. With a positive residual current, there is, however, always a current at the output. With a negative residual current, the amplifier unit would first emit a measurement signal when an amperage of the current that is to be measured (the load current) exceeds a specific level, such that lower currents can no longer be measured. The residual current is also proportionally greater with lower load currents, such that the relative error increases with respect to the transmission factor. This consequently leads to a lower accuracy of the current measurement, i.e. the determination of the load current in the semiconductor switch. The method according to the invention, as well as the device according to the invention, make it possible to reduce this error, such that lower load current amperages can also be measured. Consequently, the accuracy of the overall determination of the load current is increased.

Furthermore, steps a) and b) can be executed in an arbitrary order, or simultaneously, and step c) can be carried out after steps a) and b). It is also conceivable that the comparison pursuant to step c) is already, at least partially, carried out simultaneously with steps a) and b), wherein the first and second measurement results can at least be partially referenced in order to determine the corrected measurement results. Therefore, an at least partially overlapping of the execution of steps a), b), and c) is also conceivable, wherein the first and second measurement results can also be referenced asynchronously in step c).

Advantageously, it can be provided in the framework of the invention that the comparison takes place through at least one arithmetic operation, wherein the first transmission factor and the second transmission factor are used, in particular, as known values for the arithmetic operation. The arithmetic operation, or a series of at least 2, 3, 4, and/or 5 different arithmetic operations, can be carried out, e.g. by a component of the semiconductor switch unit, in particular internally, e.g., by a logic unit and/or by a control/evaluation device. It may also be provided that an external control/evaluation device for executing the at least one arithmetic operation is (electrically) connected to the semiconductor switch. The comparison and/or the arithmetic operation causes the error, and in particular residual current, in the first measurement result and the second measurement result, to be reduced and/or substantially eliminated, such that a corrected measurement result having a reduced error is calculated. It is essential to the invention thereby, that at least 2 measurement results having different transmission factors are used for the calculation. By way of example, the arithmetic operations shall be described below, wherein the corrected measurement result (I_korr) can be determined, e.g., through the following formulas. For this, a first measurement result (I_m1) and a second measurement result (I_m2) must first be determined in accordance with steps a) and b):

$$I\_m1 = IL/k1 + IF \qquad (1)$$

$$I\_m2 = IL/k2 + IF \qquad (2)$$

IL is the load current, and k1 is the first transmission factor, and k2 is the second transmission factor, and IF is the error, or residual current, and "I" is the operator for division, and "+" is for addition. The residual current is (at least nearly) identical for both measurements. The comparison subsequently takes place, wherein the formula (1) is converted according to the IF, and then used in formula (2) in for IF.

$$IF = I\_m1 - IL/k1 \qquad (3)$$

$$I\_m2 = IL/k2 + I\_m1 - IL/k1 \qquad (4)$$

This results in the corrected measurement result, or the measurement signal at the output of the measuring device:

$$I\_korr = IL = (I\_m2 - I\_m1)/(1/k2 - 1/k1) \qquad (5)$$

The result, i.e. the corrected measurement result, is thus independent of the residual current.

It is furthermore conceivable that the first measurement and the second measurement take place simultaneously and/or alternatingly, and take place internally, in particular, through the semiconductor switch, wherein preferably, the comparison of the first measurement result with the second measurement result, in particular in accordance with step c), takes place externally from the semiconductor switch (i.e. outside of the semiconductor switch). As a result, a more cost-effective and compact construction of the semiconductor switch unit is obtained. In order to carry out the comparison, an external control/evaluation device, for example, can be electrically connected to the output of the measuring device, in order to receive the measurement signal.

Furthermore, it can be provided in the framework of the invention that the first transmission factor and the second transmission factor are predetermined and/or are in a fixed relationship to one another, and preferably the first transmission factor is a whole number multiple of the second transmission factor. This results in the advantage of a simple calculability of the corrected measurement results that can be implemented cost-effectively. The transmission factors can be predetermined thereby, e.g. through an appropriate selection of the components of the measuring device, in particular a first measuring unit and a second measuring unit. In order to be able to make a second measurement with a transmission factor, a second measuring unit, in particular, can be incorporated in the semiconductor switch, in addition to the first measuring unit. Furthermore, a selection switch unit can preferably be integrated in the semiconductor switch, which is electrically connected to the first measuring unit and the second measuring unit, and can switch back and forth between the first measuring unit and the second measuring unit. The selection switch unit is activated, e.g. by a logic unit, wherein an external activation, e.g. by the control/evaluation device can take place through a control input. Furthermore, it may be provided that the measurement signal at the output of the measuring device, and in particular, the residual current of the measuring device, is always positive.

A device for determining a load current is likewise the subject matter of the invention, having a semiconductor switch, in particular for a vehicle, or motor vehicle, wherein the semiconductor switch has at least one measuring device and at least one semiconductor switch unit for connecting the load current to a load, wherein a first measuring unit and a second measuring unit are provided for executing measurements of the load current, in order to obtain a corrected measurement result through a comparison of the measurements. In this manner, the device according to the invention has the same advantages as those comprehensively explained in reference to a method according to the invention. The device according to the invention can preferably be operated thereby in accordance with a method according to the invention. The measuring device preferably has at least one measuring unit thereby, in particular the first measuring unit and the second measuring unit. The first and second measuring units are preferably disposed in the semiconductor switch unit, and/or in particular, are monolithic and/or integrated entirely inside the semiconductor switch unit. Furthermore, with the device according to the invention, an electrical measurement signal output is provided for outputting a measurement signal of the measuring device as a function of the load current, and/or of the corrected measurement result, and/or of a first measurement result of the first measuring unit, and/or of a second measurement result of the second measuring unit. The measurement signal output serves, by way of example, for recording the corrected measurement results or for an external recording of the first and/or second measurement results, or corresponding measurement signals, respectively, through, e.g., a control/evaluation device, in order to determine the corrected measurement result on the basis of these measurement results/measurement signals. The first and second measuring units can be disposed thereby in the semiconductor switch, and in particular in a semiconductor switch unit, such that a measurement of the first and second measuring units takes place simultaneously or successively on the electrical line that has the load current.

It is furthermore conceivable that the first measuring unit determines and/or has a first transmission factor, and the second measuring unit determines and/or has a second transmission factor, wherein the first transmission factor differs from the second transmission factor, in order to thus identify an error in the measurement results. The first measuring unit and the second measuring unit can be configured thereby, such that the first transmission factor is a whole number multiple of the second transmission factor, and/or the first transmission factor and the second transmission factor are in a fixed relationship to one another. It is also conceivable to use further measuring units having further transmission factors for determining the load current and/or a comparison thereof is used for determining the corrected measurement results.

Advantageously, it can be provided with the invention that the semiconductor switch is configured as an intelligent, integrated semiconductor switch for measuring a load current, and preferably has an integrated protection device, in particular for protection against a short circuit and/or an electrical surge. The protection device can have protection units, for example, which interrupt the current flow when a predetermined amperage has been exceeded. In this manner, a safe and reliable operation of the device according to the invention is ensured. The protection device and/or at least one protection unit can furthermore be integrated, in particular, entirely in the semiconductor switch.

It is also conceivable that the first measuring unit and the second measuring unit are integrated, in particular entirely and/or monolithically, in the semiconductor switch unit, wherein the semiconductor switch unit is configured in particular as a power semiconductor switch and/or as a power MOSFET (metal-oxide-semiconductor field-effect transistor). As a result, the possibility arises of sending high load currents through the semiconductor switch as well, in particular a maximum of up to 10 A, and/or 20 A, and/or 30 A, and/or 40 A, and/or 100 A, and/or 200 A. The semiconductor switch unit can be integrated, in particular entirely and/or monolithically, in the semiconductor switch, wherein the semiconductor switch also has further integrated components, e.g. a logic unit, and/or an amplifier unit, and/or a protection device. The semiconductor switch unit, and/or the semiconductor switch, and/or the measuring units, and/or the logic unit, and/or the amplifier unit are preferably configured as semiconductor components.

Furthermore, it may be advantageous in the framework of the invention, if an, in particular electronic, selection switch unit, in particular a multiplexer, is provided, wherein the first measuring unit and the second measuring unit are electrically connected to the selection switch unit such that a first measurement with the first measuring unit and a second measurement with the second measuring unit can be activated with the selection switch unit. The selection switch unit can be activated externally, in particular, by a control/evaluation device, for example.

It is furthermore conceivable that a control/evaluation device, in particular a microcontroller, is electrically connected to the semiconductor switch, in particular such that an evaluation of a first measurement result of the first measuring unit and a second measurement result of the second measuring unit can be carried out by the control/evaluation device. The device according to the invention preferably includes the control/evaluation device, which is electrically connected to the semiconductor switch. The control/evaluation device can be connected, e.g. with both at least one control input and/or at least one measurement signal output. Thus, the control/evaluation device can control the measurement procedure through an electrical activation of the selection switch unit, e.g. switching between the first measuring unit and the second measuring unit, and/or simultaneously receive the measurement signals, determine the measurement results, and determine a corrected measurement result through a comparison of the first and second measurement results. In this manner, a simple and cost-effective construction is achieved, in order to obtain an improved corrected measurement result for the load current.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
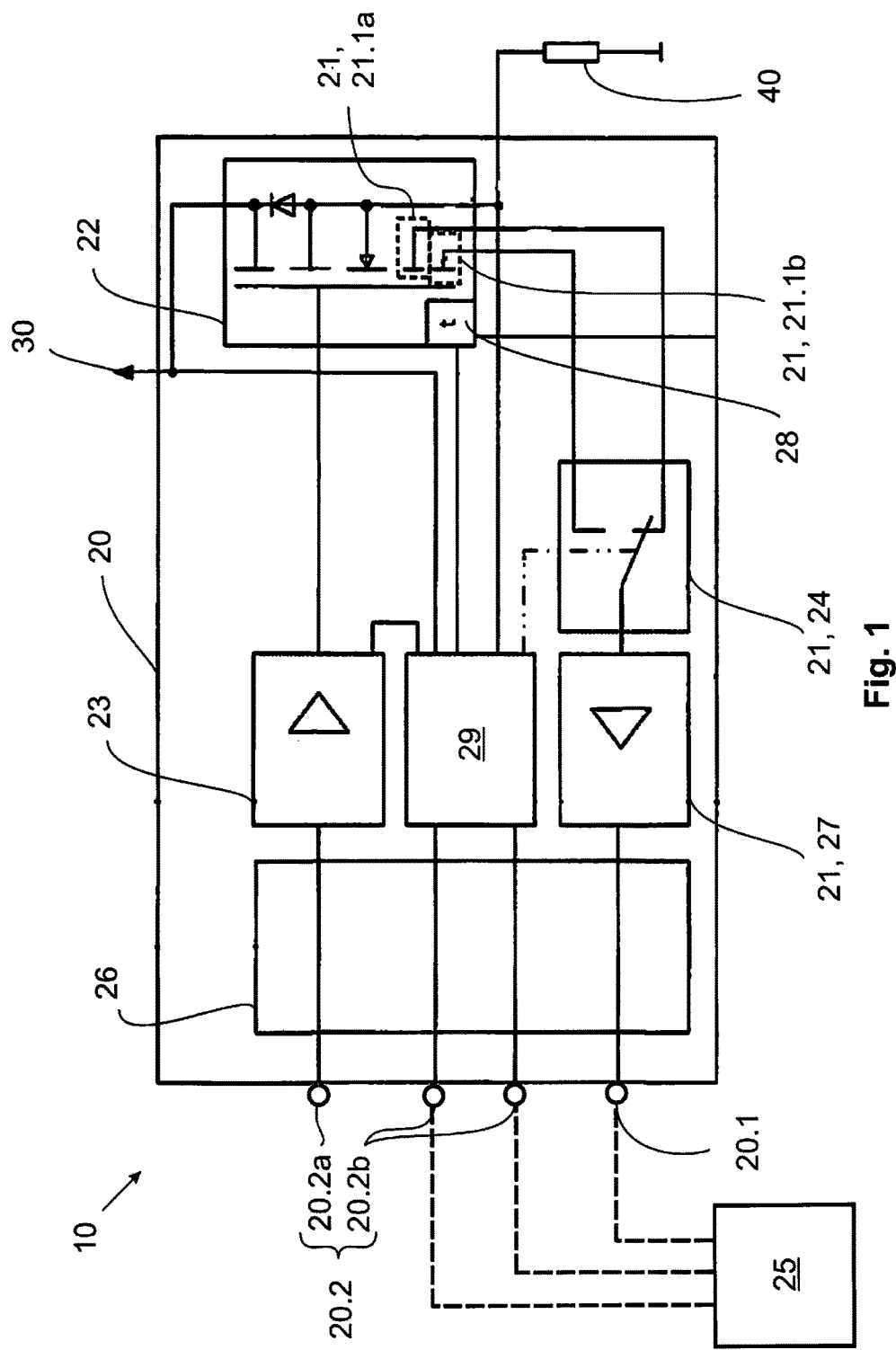
FIG. 1 shows a schematic circuit diagram of parts of a device according to the invention and a semiconductor switch.

FIG. 1 shows a schematic circuit diagram of a device 10 according to the invention, wherein the device 10 comprises a semiconductor switch 20. The semiconductor switch 20 further has a semiconductor switch unit 22, in particular integrated therein. The semiconductor switch unit 22 and/or the semiconductor switch 20 are electronic components and in particular electronic or semiconductor switches, which implement the function of an analog switch, like a relay, in the form of a semiconductor component. For this, the semiconductor switch 20 and/or the semiconductor switch unit 22 has, in particular, at least one field effect transistor, in particular a power MOSFET, or is configured as a power MOSFET or field effect transistor. Furthermore, a device 10 according to the invention has a power supply 30, which enables, in particular, a load current IL of a load 40 to be conducted through the semiconductor switch unit 22, or through the semiconductor switch 20. When switched on, the semiconductor switch unit 22 allows a load current to flow through the load 40, wherein when the switch is switched off, the load current ceases to flow. The power supply 30 for the semiconductor switch 20 is also connected to the logic unit 29 and/or the semiconductor switch unit 22. Further control inputs 20.2 are provided on the semiconductor switch unit 22, in order to be able to control the switching process externally. An activation unit 23, a MOSFET gate driver in particular, which has an integrated charge pump, is activated via a first electrical control input 20.2a. The output of the activation unit 23 controls the semiconductor switch unit 22 thereby. The output of the activation unit 23 is preferably electrically connected to a gate of the semiconductor switch unit 22 (configured as a power MOSFET). A further control of the semiconductor switch 20, in particular of a protection device 26, takes place via a logic unit 29. The logic unit 29 is preferably integrated in the semiconductor switch 20, and has two control inputs 20.2b. Functions of the logic unit 29 can be activated from the exterior via the second control inputs 20.2b. In addition to the activation, e.g., of the protection device 26, this also enables, e.g., an activation of a temperature measuring unit 28 via the logic unit 29. If applicable, a measuring device 21 can also be controlled and/or evaluated by the logic unit 29. The measuring device 21 has a first measuring unit 21.1a and a second measuring unit 21.2b, each of which measures the load current IL, and sends a measurement signal, electrically, to an amplifier unit 27. The measurement signal is subsequently modified by the amplifier unit 27; in particular, amplified and output at the measurement signal output 20.1. In particular, all of the control inputs 20.2 and outputs, in particular the measurement signal output 20.1, are protected against voltage surges by the protection device 26.

In order to be able to switch between a first measuring unit 21.1a and a second measuring unit 21.1b, the semiconductor switch 20 also has a selection switch unit 24, which is electrically connected to both the first measuring unit 21.1a and the second measuring unit 21.1b. An external control signal and/or the logic unit 29, in particular, can activate the selection switch unit 24 thereby. The selection switch unit 24 can output either a first measurement signal of the first measuring unit 21.1a or a second measurement signal of the second measuring unit 21.1b to the amplifier unit 27, depending on this activation, wherein the amplifier unit 27 amplifies the signal output by the selection switch unit 24, and outputs it as a measurement signal at the measurement signal output 20.1. As is depicted by a broken line, the device according to the invention can also have a control/evaluation device 25. The control/evaluation device 25 serves to activate the semiconductor switch 20 thereby, in particular the logic unit 29, via the control inputs 20.2, and in particular the second control inputs 20.2b. The control/evaluation device 25 can also measure and evaluate the signal at the measurement signal output 20.1, in order to determine the corrected measurement result. For this, the control/evaluation device 25 is disposed externally to the semiconductor switch.

Figure 2:
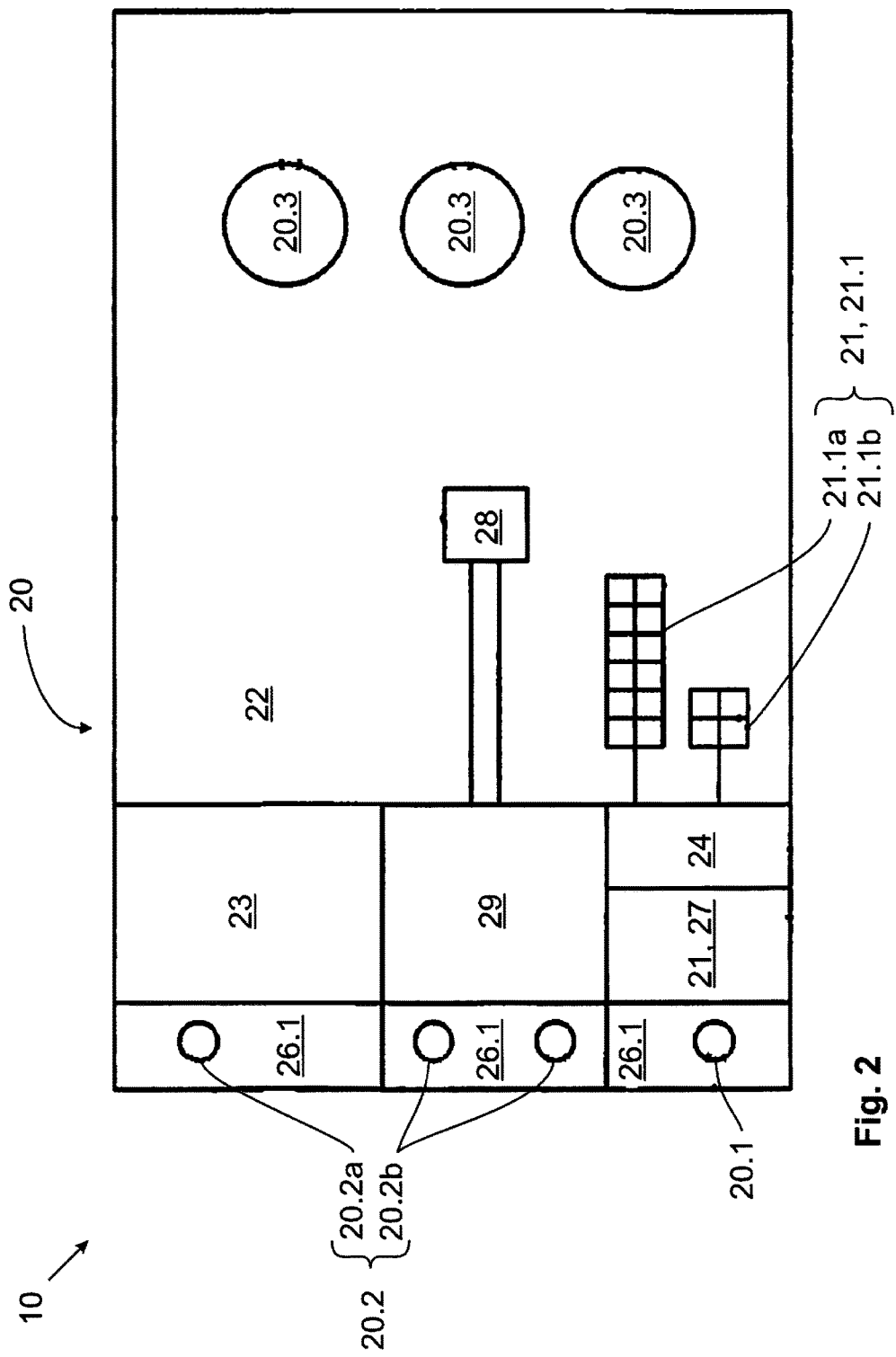
FIG. 2 shows a schematic depiction of a device according to the invention and a semiconductor switch.

In FIG. 2, a further schematic depiction of parts of a device 10 according to the invention is shown. In particular, the control inputs 20.2, i.e. a first control input 20.2a and a second control input 20.2b, and/or the measurement signal output 20.1 and/or the semiconductor switch output 20.3 are configured as bond-pads. The bond-pads have, in particular, alloyed and/or doped gold and/or aluminum and/or copper, in order to ensure a reliable electrical conductance. As can also be seen in FIG. 2, the measuring units 21.1, i.e. a first measuring unit 21.1a and a second measuring unit 21.1b, are integrated, together with a temperature measuring unit 28, in the semiconductor switch unit 22, while the semiconductor switch unit 22, the activation unit 23, the logic unit 29, the amplifier unit 27, and the selection switch unit 24, and in particular the protection units 26.1 of the protection device 26, are integrated in the semiconductor switch 20. The switching between the first measuring unit 21.1a and the second measuring unit 21.1b takes place thereby through the selection switch unit 24, and is activated, in particular, via signals at the control inputs 20.2, in particular the second (external) control inputs 20.2b.

Figure 3:
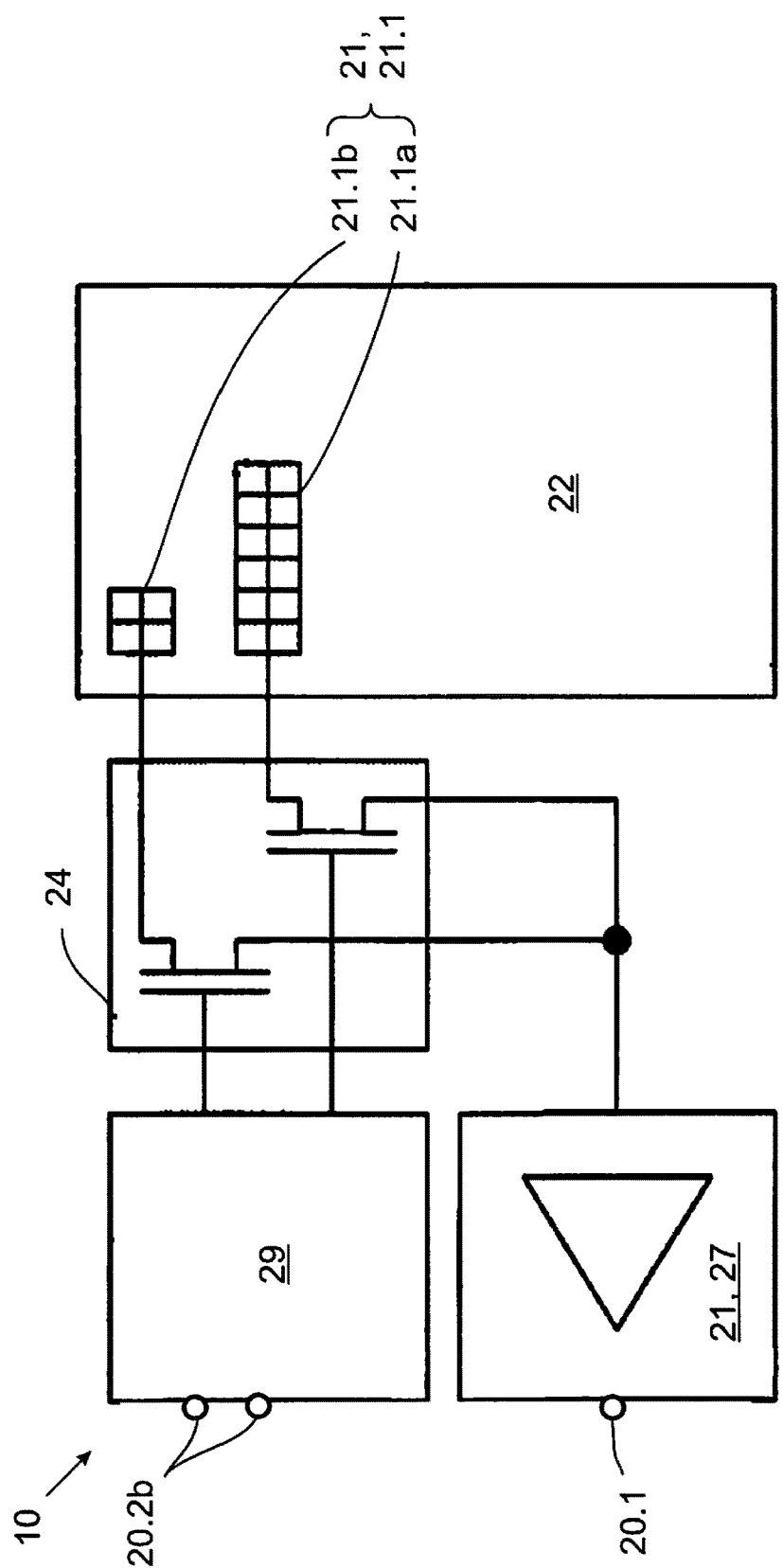
FIG. 3 shows another schematic depiction of a device according to the invention and a semiconductor switch.

A further schematic depiction of parts of the device 10 according to the invention is shown in FIG. 3. The first measuring unit 21.1a and the second measuring unit 21.1b are integrated thereby in the semiconductor switch unit 22. Furthermore, second control inputs 20.2b are provided on a logic unit 29, and the measurement signal output 20.1 is provided on the measuring device 21. The measuring device 21 comprises, in particular, the amplifier unit 27, a first measuring unit 21.1a and a second measuring unit 21.1b.

Figure 4:
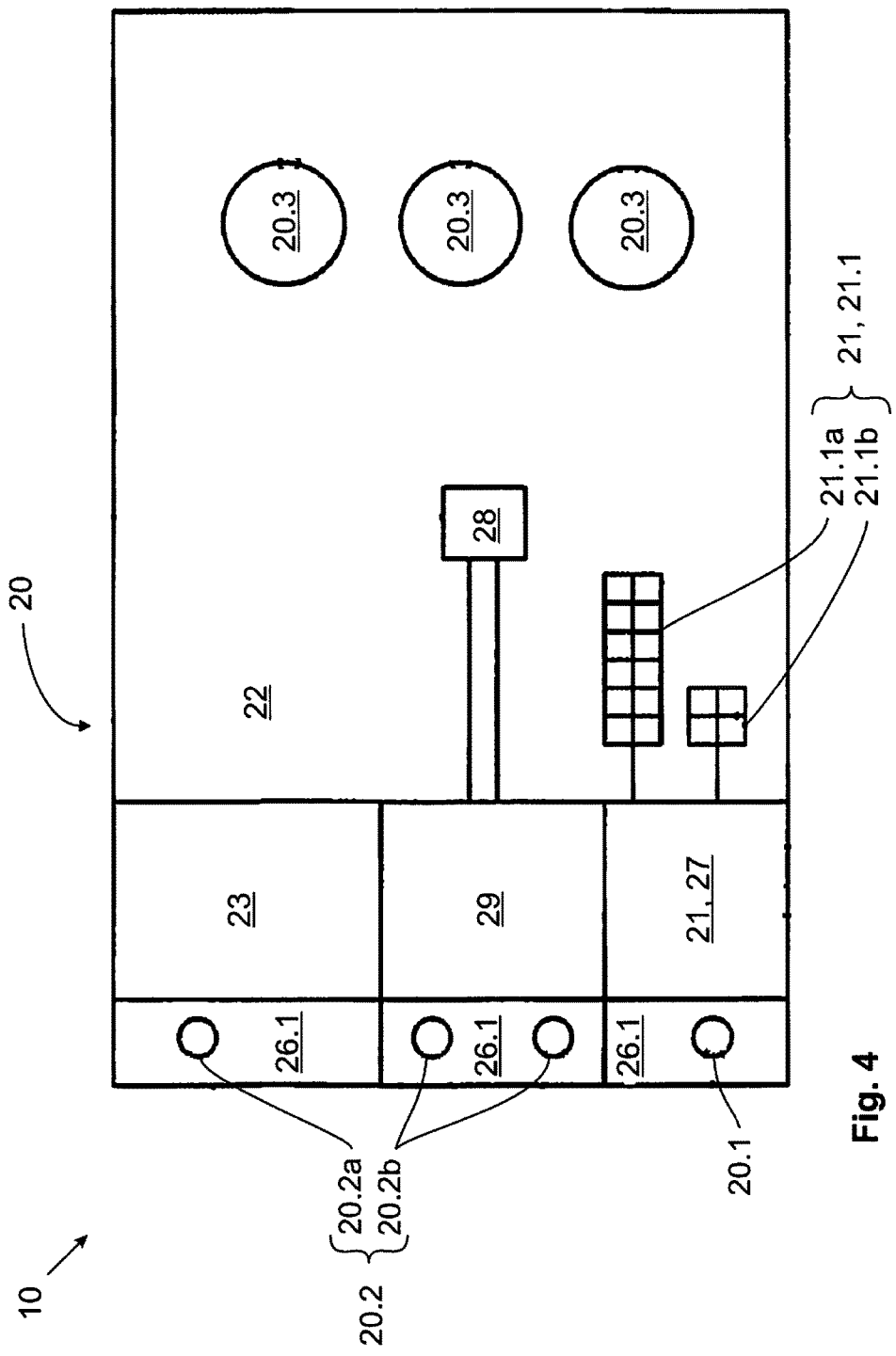
FIG. 4 shows another schematic depiction of a device according to the invention and a semiconductor switch.

FIG. 4 shows a further schematic depiction of parts of the device 10 according to the invention. The evaluation of the first measuring unit 21.1a and the second measuring unit 21.1b takes place internally here, i.e. in and/or through the semiconductor switch 20. Accordingly, a selection switch unit 24 is not provided. The amplifier unit 27 and/or an internal control/evaluation device 25 can fulfill the function of the external control/evaluation device 25, and can carry out a, preferably integrated analog and/or digital (signal) evaluation (of the measurement signals and/or measurement results), in particular in order to determine the corrected measurement results pursuant to step c). Preferably, during the analog evaluation, the measurement signals of the measuring units 21 are recorded in parallel, and evaluated by an analog circuit, through at least one arithmetic operation. The result of this evaluation, in particular the corrected measurement result, is then output at the measurement signal output 20.1. With the digital evaluation, the measurement signals of the measuring units 21 are preferably recorded serially, e.g. via a chopping method. The at least one arithmetic operation then takes place digitally, through a digital, internal control/evaluation device 25. The (corrected) measurement result can then be output as a digital and/or serial readable measurement signal at the measurement signal output 20.1. A digital/analog converter can likewise be provided, in order to convert the digital measurement signal into an analog measurement signal, and to output it at the measurement signal output 20.1.

Figure 5:
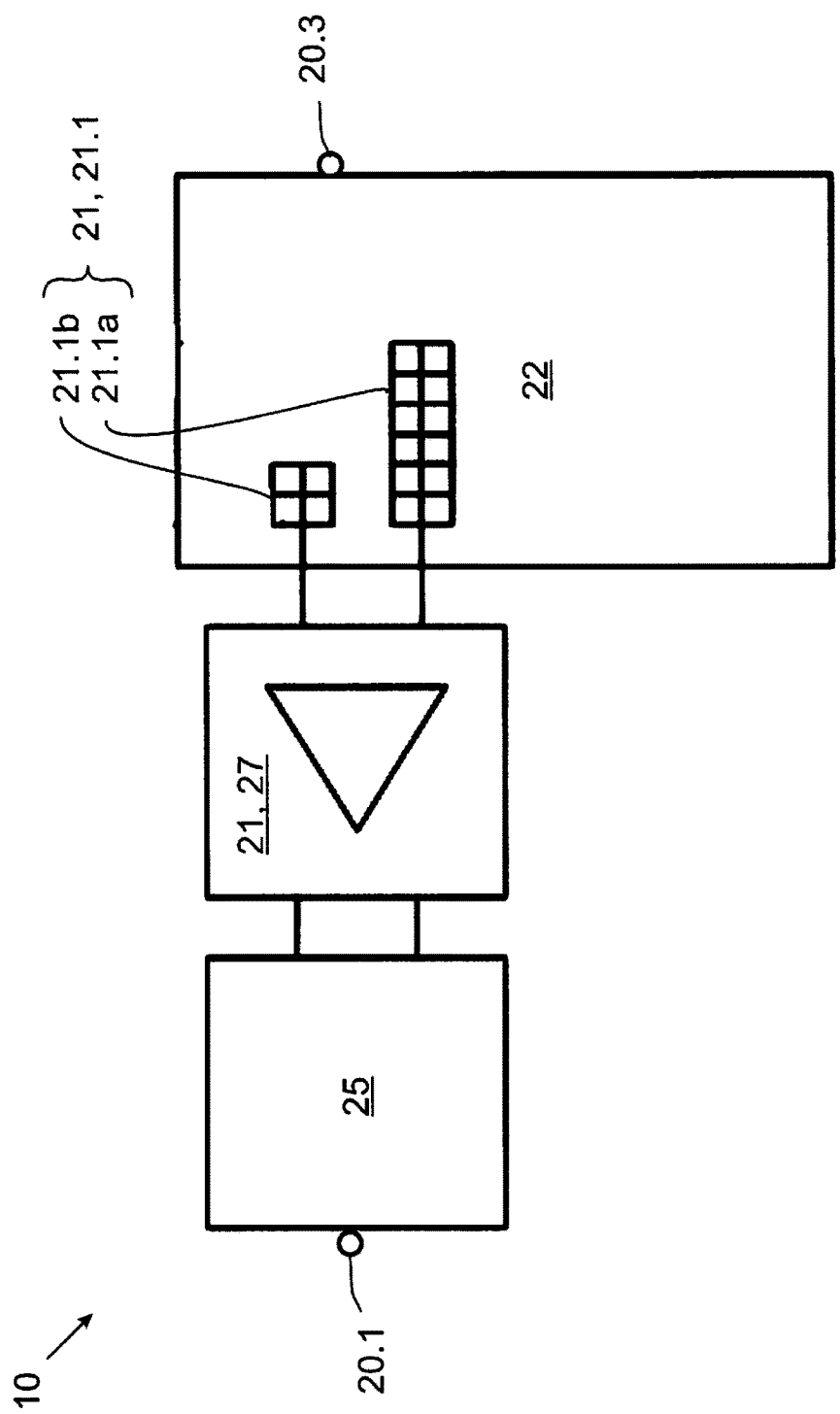
FIG. 5 shows another schematic depiction of a device according to the invention and a semiconductor switch.

FIG. 5 shows a further schematic depiction of the device 10 according to the invention, wherein an internal control/evaluation device 25 is provided in the semiconductor switch 20. The control/evaluation device 25 can receive signals from the amplifier unit 27 thereby, and can be electrically connected to the amplifier unit 27, and/or be integrated in the amplifier unit 27. Furthermore, the control/evaluation device 25 and/or the amplifier unit 27 and/or the semiconductor switch 20 can include different evaluation components for executing the digital (signal) evaluation. These evaluation components are, e.g., at least one analog/digital converter, and/or one computer unit, such as a microprocessor and/or a digital/analog converter, and/or a serial interface, and/or an analog output stage, and/or a digital, serial output stage. A reliable digital evaluation is ensured in this manner.

Figure 6:
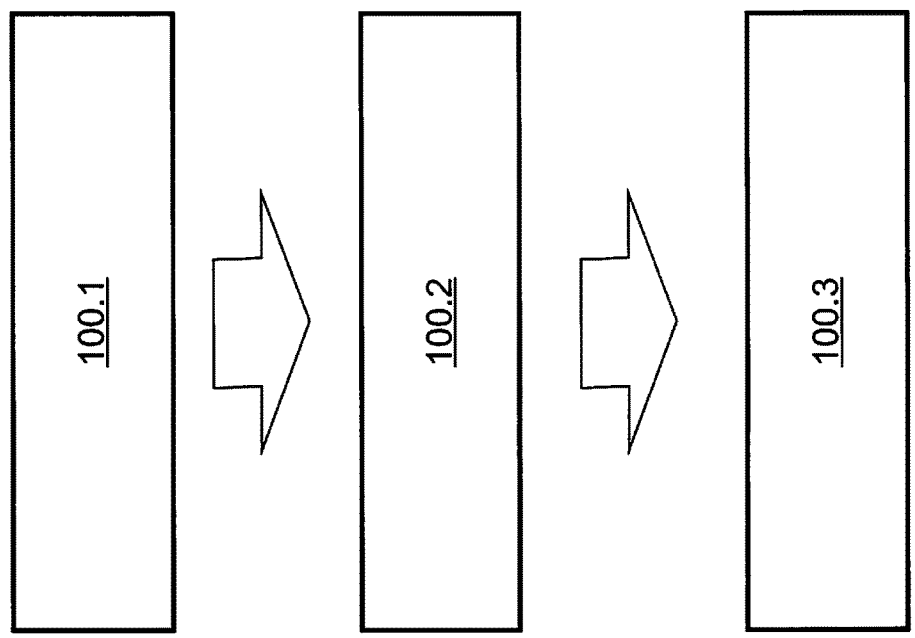
FIG. 6 shows a schematic depiction for visualizing a method according to the invention.

FIG. 6 illustrates, schematically, a method 100 according to the invention. In a first method step 100.1, the execution of a first measurement of the load current IL takes place with a transmission factor k1 thereby, wherein a first measurement result is determined with the first measurement. Pursuant to the second method step 100.2, a second measurement of the load current IL is carried out, wherein a second transmission factor k2 is used in the second measurement. The second transmission factor k2 differs from the first transmission factor k1 thereby. A second measurement signal is determined with the second measurement. Pursuant to a third method step 100.3, a corrected measurement result is determined, in that a comparison of the first measurement result and the second measurement result is carried out, in particular such that the error IF is at least reduced.

The explanations of the embodiments above, describe the present invention exclusively in the framework of examples. As a matter of course, individual features of the embodiments can be freely combined with one another, as long as this is technologically logical, without abandoning the scope of the present invention.

LIST OF REFERENCE SYMBOLS 10 device
20 semiconductor switch
20.1 measurement signal output
20.2 control inputs
20.2a first control input
20.2b second control input
20.3 semiconductor switch output
21 measuring device
21.1 measuring unit
21.1a first measuring unit
21.1b second measuring unit
22 semiconductor switch unit
23 activation unit
24 selection switch unit
25 control/evaluation device
26 protection device
26.1 protection unit
27 amplifier unit
28 temperature measuring unit
29 logic unit
30 power supply
40 load 100 method
100.1 first method step
100.2 second method step
100.3 third method step
IL load current
IF error, residual current
k transmission factor
k1 first transmission factor
k2 second transmission factor

The invention claimed is:

1. A method for determining a load current (IL) in a semiconductor switch, said semiconductor switch including first and second measuring devices, wherein a measurement of the load current (IL) is influenced by at least one transmission factor (k), said at least one transmission factor being dependent on the first and second measuring devices, said method comprising the steps of:
   a) taking, by the first measurement device, a first measurement of the load current (IL) with a first transmission factor (k1), wherein a first measurement result is determined with the first measurement,
   b) taking, by the second measuring device, a second measurement of the load current (IL) with a second transmission factor (k2), wherein a second measurement result is determined with the second measurement, and wherein an error (IF) is identified in the measurement results based on the differences of the first transmission factor (k1) and the second transmission factor (k2), wherein the first transmission factor (k1) and the second transmission factor (k2) are at least one of predetermined and in a fixed relationship to one another, and wherein the first transmission factor (k1) is a whole number multiple of the second transmission factor (k2), and
   c) determining, by a control and evaluation device, a corrected measurement result through a comparison of the first measurement result with the second measurement result for reducing the error (IF).

2. The method according to claim 1, wherein the comparison takes place through at least one arithmetic operation, wherein, in particular, the first transmission factor (k1) and the second transmission factor (k2) are used as known values for the arithmetic operation.

3. The method (100) according to claim 1 wherein the first measurement and the second measurement take place internally through the semiconductor switch, wherein the comparison of the first measurement result with the second measurement result takes place externally from the semiconductor switch.

* * * * *